United States Patent [19]

Namavar et al.

[11] Patent Number: 5,272,355
[45] Date of Patent: Dec. 21, 1993

[54] OPTOELECTRONIC SWITCHING AND DISPLAY DEVICE WITH POROUS SILICON

[75] Inventors: Fereydoon Namavar, Ashford, Conn.; Nader M. Kalkhoran, Malden; H. Paul Maruska, Acton, both of Mass.

[73] Assignee: Spire Corporation, Bedford, Mass.

[21] Appl. No.: 886,024

[22] Filed: May 20, 1992

[51] Int. Cl.$^5$ .............................................. H01L 45/00
[52] U.S. Cl. .......................................... 257/3; 257/55; 257/59; 257/103; 257/94
[58] Field of Search ............... 257/461, 59, 55, 53, 257/56, 77, 103, 86, 94, 96, 51, 3

[56] References Cited

U.S. PATENT DOCUMENTS

| | | | |
|---|---|---|---|
| 4,486,265 | 12/1984 | Little | 156/606 |
| 4,676,845 | 6/1987 | Spitzer | 148/33.3 |
| 4,768,072 | 8/1988 | Seki et al. | 257/53 |
| 5,103,269 | 4/1992 | Tomomura et al. | 257/94 X |
| 5,122,845 | 6/1992 | Manabe et al. | 257/94 X |

OTHER PUBLICATIONS

Burrus, C. A. & Miller, B. I., "Small Area, Double-Heterostructure Aluminum-Gallium . . . "; *Optics Communications*; vol. 4, No. 4; Dec. 1971; pp. 307–309.
Chynoweth, A. G. & McKay, K. G. "Photon Emission from Aralanche Breakdown in Silicon"; *Physical Review*; vol. 102, No. 2; Apr. 15, 1956; pp. 369–376.
Canham, L. T.; "Silicon Quantum Wire Array Fabrication by Electrachemical . . . "; *Appl. Phys. Lett*; vol. 57, No. 10; Sep. 3, 1990; pp. 1046–1048.
Halimaoui, A., C. Oules, & G. Bomchil, "Electroluminesence in the Visible Range During Anodic Oxidation . . . "; *Appl. Phys. Lett.*, vol. 59, No. 3; Jul. 15, 1991; pp. 304–306.
A. K. Ghosh, C. Fishman & T. Feng, "Theoretical Efficiency of SnO$_2$/Si Solar Cells," *J. Appl. Phys.*; vol. 50, No. 5; May 1979; pp. 3454–3458.
V. Lehmann & U. Göscle, "Porous Silicon Formation: A Quantum Wire Effect," *Appl. Phys. Lett.*, vol. 58, No. 8; Feb. 1991; pp. 856–858.
H. P. Maruska, A. K. Ghosh, D. J. Eustau, T. Feng, "Interfacial Stability of SnO$_2$/n-Si and In$_2$O$_3$-Sn/N-Si . . . ", *J. Appl. Phys.*; vol. 54, No. 5; May 1983; ppl. 2489–2499.
W. Michaelis, M. H. Pilkuhn, "Radiative Recombination in Silicon p-n Junctions"; *Phys. Stat. Sol.*; vol. 36, No. 311 (1969); pp. 311–319.
F. Nomaver, E. Cortesi, P. Sioshangi, "Low-Defect, High Quality Simox Produced by Multiple Oxygen . . . "; *Mat. Res. Soc. Symp. Proc.*; vol. 128 (1989) pp. 623–628.
F. Namaver, E. Cortisi, R. F. Pinizzotto, H. Yang, "Effect of Oxygen Implantation Conditions on . . . ", *Mat. Res. Soc. Symp. Proc.*; vol. 157 (1990) pp. 179–184.
R. Newman, "Visible Light from a Silicon p-n Junction," *Physical Review*; vol. 100, No. 2; Oct. 15, 1955; pp. 700–703.
A. Richter, P. Steiner, F. Kozlowski, W. Lang, "Current-Induced Light Emission from a Porous Silicon Device," *IEEE Electron Device Letters*; vol. 12, No. 12; Dec. '91 pp. 691–692.
A. G. Dentai, T. P. Lee, C. A. Burrus, "Small Area, High-Radiance C. W. InGaAsP . . . "; *Electronics Letters*; vol. 13, No. 16; Aug. 4, 1977; pp. 484–486.

*Primary Examiner*—William Mintel
*Attorney, Agent, or Firm*—Morse, Altman, Dacey & Benson

[57] ABSTRACT

A solid state optoelectronic switching and display device and a method for its manufacture are disclosed. The device, formed in silicon, essentially is a surface-emitting visible light-emitting diode that allows rapid and efficient switching and information transfer, via optical means, between IC's, PC boards and displays in a computer. The method essentially includes electrochemically etching a silicon wafer to form a porous silicon region therein, depositing a transparent semiconductor layer on the porous silicon region, and forming a back contact on the wafer.

10 Claims, 4 Drawing Sheets

OPTOELECTRONIC SWITCHING AND DISPLAY DEVICE WITH POROUS SILICON

This invention was made, at least in part, with United States Government support and the U.S. Government has certain rights in the invention.

BACKGROUND OF THE INVENTION

1. Field of the Invention

The present invention relates generally to electronic devices and circuits and, more particularly, to a solid state optoelectronic switching and display device and a method of its manufacture.

2. The Prior Art

Electronic integrated circuits (IC's) and very-large-scale integrated circuits (VLSI's), both commonly referred to as chips, are formed of silicon (Si). Silicon and the chips made from silicon are the basic building blocks of computer systems. Typically, PC boards contain over 300 chips, and VLSI chips have about 500 to 1,000 wire-bonded pins. The interconnections among the myriad component parts of computer systems are still formed, however, by low speed large area nests of copper wiring, soldered or otherwise secured to pins of chips to convey data electrically therebetween. Such low speed interconnectings create massive bottlenecks in data transfer between chips and PC boards. Further, computer displays of processed data are, for the most part, bulky cathode ray tubes. As a consequence, present day computers are not only heavier and bulkier than they could be, but also are slower than they need be. A monolithically integrated all solid state system could solve both drawbacks. Such an all solid state system will allow not only for fast and efficient information processing within the chips of the system but also for rapid and efficient transfer of data among those chips. Further, such an all solid state system also will allow for considerable reduction in both weight and bulk therein, featuring flat panel optical displays. One suggested solution lies in using solid state devices whose output is electromagnetic radiation rather than electricity. A solid state system employing data transfer in the form of electromagnetic radiation allows serial, rather than parallel, data transfer at near the speed of light and with low power consumption, no RF interference problems, and with high reliability.

Most workers in the field have concentrated their efforts in providing hybrid approaches by employing standard GaAs light-emitting devices in an otherwise solid state system based on silicon. The most promising III–V light-emitting compounds, however, are not suitable for direct deposition onto silicon substrates due, inter alia, to lattice and thermal expansion coefficients mismatch. Consequently, the performance characteristics of III–V compound light-emitting devices formed on silicon have been unacceptably low. Approaches involving securing GaAs-type devices onto silicon wafer surfaces by soldering or with glue have proved to be a labor intensive, time consuming, hence costly procedure. Although GaAs and its alloys offer the promise of lightweight, polychrome flat panel displays for computers, these compound semiconductors generally are found to be far too expensive for use as large area video display panels for computers. Low cost visible light emitters based solely on solid state silicon technology could be the answer to most, if not all, of the above problems.

Standard crystalline silicon is, however, unsuitable for light emission due to its indirect optical band gap. Certain III–V compounds, in contrast, possess a direct energy gap corresponding to wavelengths in the red, the orange, the yellow, and the green regions of the visible spectrum. Although some luminescence in the near infrared (near IR) region in standard crystalline silicon samples is detectable, such luminescence is extremely weak and of no practical use for light emission devices.

Some workers in the field have recently observed that porous silicon, a spongy phase of Si, also referred to as mesoporous Si, exhibits quantum confinement effects leading to a considerable increase in the effective energy gap. See V. Lehmann et al., "Porous Silicon Formation: A Quantum Wire Effect," *App. Phys. Lett.* 58 (8), 25 Feb. 1991, pgs. 856–858. Another worker in the field has reported observing visible red photoluminescence from porous silicon when excited by an argon laser. See L. T. Canham, "Silicon Quantum Wire Among Fabrication by Electrochemical and Chemical Dissolution of Wafers," *Appl. Phys. Litt.* 57 (10), 3 Sep. 1990, pgs. 1046–1048. Recently, other workers have succeeded in forming liquid junction devices using aqueous HCl or $KNO_3$ solutions to contact porous silicon. The red light emission of their devices, however, lasted only a few minutes due to oxidation reactions at the porous Si/aqueous interface. See A. Halimaoui et al., "Electroluminescence In The Visible Range During Anodic Oxidation of Porous Silicon Films," *App. Phys. Lett* 59 (3), 15 Jul 1991, pgs. 304–306. That an impenetrable film of silicon oxide will form on a silicon surface subjected to an anodic bias in an aqueous environment is well established from thermodynamic principles.

SUMMARY OF THE INVENTION

It is a principal object of the present invention to overcome the above shortcomings by providing a solid state optoelectronic switching and display device for high powered computers that employs light, rather than electricity, for data transmission and display, and a method for its manufacture.

More specifically, it is an object of the present invention to provide a solid state optoelectronic switching and display device, formed in silicon, that essentially comprises a silicon wafer having opposed flat surfaces, a porous silicon region formed in the silicon wafer adjacent one of the opposed flat surfaces, and a transparent semiconductor layer deposited on the porous silicon region of the silicon wafer. The formation of a back contact layer adjacent the other of the opposed flat surfaces of the silicon wafer and the provision of means for applying a voltage potential between the back contact layer and the transparent semiconductor layer completes the formation of the solid state optoelectronic switching and display device. The device is essentially a surface-emitting visible light-emitting diode that employs light beams instead of electricity to transmit and to display data, and does so rapidly and efficiently. The silicon substrate and the transparent semiconductor layer are of opposed polarity, i.e., when one is of p-type, the other must be of n-type.

Other objects of the present invention will in part be obvious and will in part appear hereinafter.

The invention accordingly comprises the product and the process of the present disclosure, its components, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENTS

Figure 1:
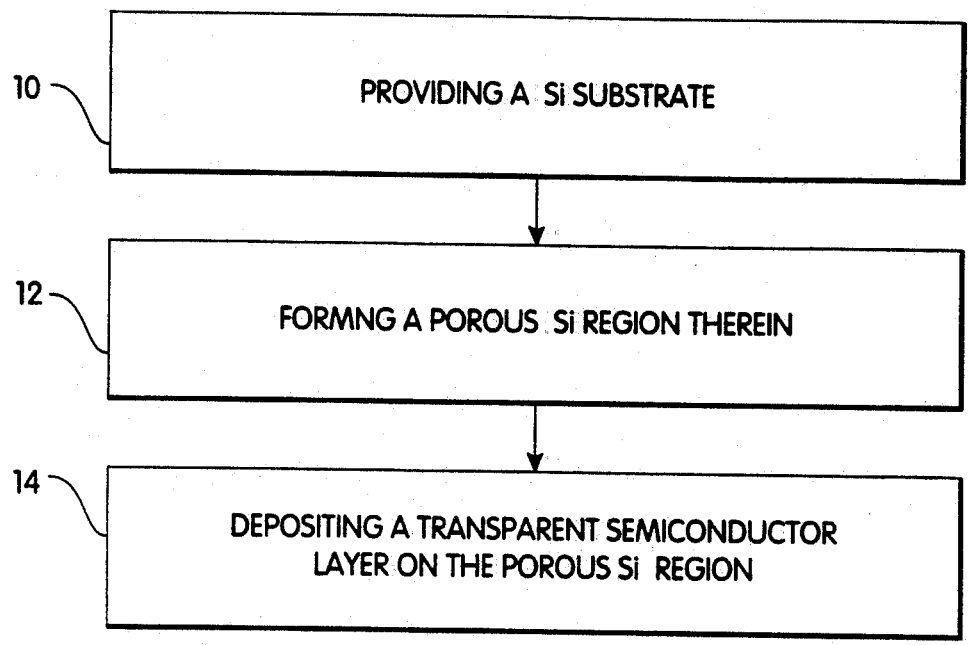
FIG. 1 is a flow chart of a preferred process of making a solid state optoelectronic switching and display device according to the invention.

In general, the present invention provides a high efficiency solid state optoelectronic switching and display device that employs light and not electricity to transmit and display data between operative components of supercomputers, and a method for its manufacture.

As known, single-crystal silicon is and has been for some time the basic building block for most electronic integrated circuits (IC's) and very-large-scale integrated circuits (VLSI's) used in high speed computers. The interconnectors therebetween are, however, low speed, large area nests of copper wiring carrying data in encoded electrical form. Data displays usually are bulky cathode ray tubes. Such low speed interconnections create massive bottlenecks to data transmission within a computer and slow it down unnecessarily. With present day VLSI chips approaching 500–1,000 wire-bonded pin levels and with typical PC boards containing in excess of 300 such chips, there has been a need to speed up data transmission therebetween.

As also known, light travels much faster than electricity. Consequently, a computer system employing light-emitting devices and photovoltaic detectors, formed entirely in silicon and integrated into the silicon chips, and using light for data transfer and display will remove the present day bottlenecks and speed up the computer. Building such light-emitting devices and photovoltaic detectors entirely in silicon is no simple matter, however.

Applicants have been fortunate in drawing on some of the involvement in a related field of their assignee, Spire Corporation of Bedford, Mass. Spire Corporation has been a pioneer in the field of photovoltaics, involving the conversion of electromagnetic radiation to electricity. See U.S. Pat. No. 4,486,265, entitled "Process of Making Thin Film Materials for High Efficiency Solar Cells," granted to Roger G. Little on Dec. 4, 1984. See also U.S. Pat. No. 4,676,845, entitled "Passivated Deep P/N Junction", granted to Mark B. Spitzer on Jun. 30, 1987. The task at hand is essentially the reverse, namely to convert a voltage applied to a device so that it emits radiation in the visible spectrum. As known, electromagnetic radiation in the visible range of the spectrum (i.e., light, visible radiation or light radiation) encompasses wavelengths from about 400 to about 770 nanometers, that is from the extreme violet to the extreme red.

The above mentioned U.S. Pat. No. 4,486,265 of Roger G. Little has noted the advantages of a III - V compound, GaAs, over single crystal silicon for use in photovoltaic conversion. It also noted that such compounds are not readily deposited onto silicon substrates due to lattice and thermal coefficients mismatches and provided a process for solving the deposition problem. Regretfully, such III - V compounds are far too expensive for extensive use as large area video display panels or for widespread use as switching devices. A relatively simple and inexpensive method and a resultant low-cost product, discovered by the applicants and disclosed and claimed herein, appears to hold the promise of an answer to making computers faster, less expensive and yet more reliable.

THE EMBODIMENT OF FIGS. 1 AND 2

FIG. 1 is a flow chart of one preferred process of making a solid state high efficiency optoelectronic switching and display device according to the invention. The process essentially includes the steps of providing 10 a silicon substrate, forming 12 a porous-silicon region in the silicon substrate, and depositing 14 a transparent semi-conductor layer on the porous-silicon region of the silicon substrate.

Figure 3:
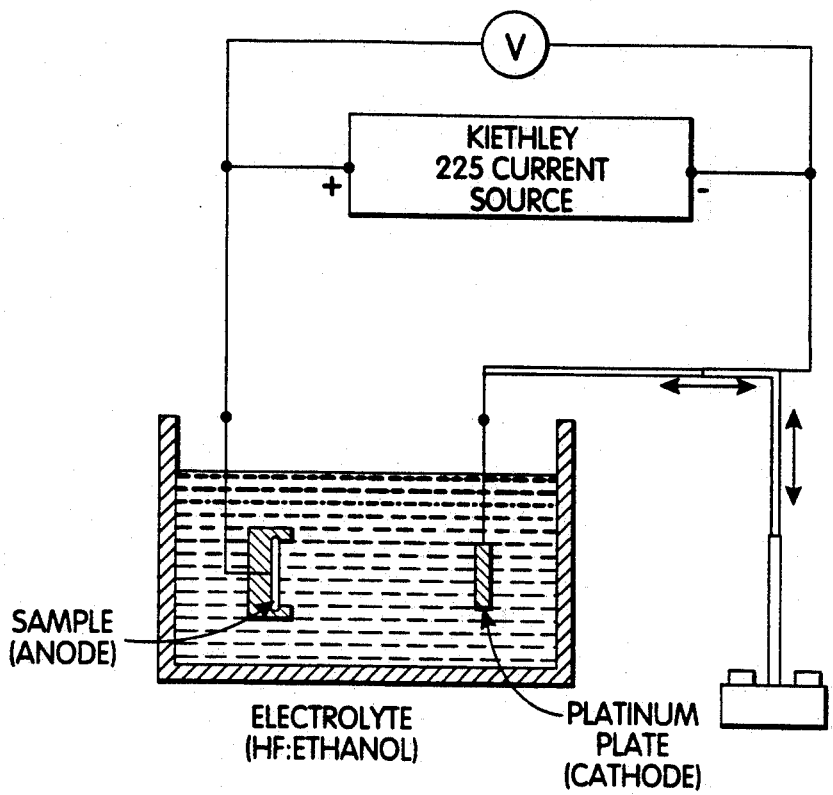
FIG. 3 is a schematic diagram of one preferred system used for forming the porous silicon region.

Preferably, the silicon substrate is a polished p-type (boron doped) or n-type (phosphorus doped) single-crystal Si(100) or Si(111) wafer that posesses a resistivity ranging from about 0.001 ohm-cm to about 50 ohms-cm. Preferably, the porous-silicon region is formed in the silicon substrate in an ethanoic hydroflouric acid solution (ethanol 1:1 HF) and at low current densities ranging from about 1 mA/cm$^2$ to about 50 mA/cm$^2$. This is desirable so that the electrochemical reaction is limited by the supply of positive electronic carriers (holes) to the substrate surface rather than the chemical species in the HF acid solution. The solution preferably is contained in a teflon coated glass vessel and the silicon substrate is secured in a specifically prepared jig which only exposes the front surface of the silicon substrate to the action of the HF acid solution. This arrangement also allows for the electrical back contact to remain isolated from the solution One such preferred anodic etching system is illustrated in a schematic diagram in FIG. 3. The silicon substrate, if p-type, as illustrated, is given a positive (anodic) bias during the etch procedure. In case of an n-type silicon substrate, the bias remains of the same polarity (positive) but illumination with an incandescent light is necessary to photogenerate the required holes. The duration of the etch procedure preferably is from about 10 minutes to about 120 minutes. We found that the duration of this etch procedure was one factor which controlled the resultant peak wavelength (hence its predominant color) at which photoluminescence of the finished device occurs, as more fully described with reference to FIG. 4 below. The etch procedure preferably is followed by allowing the silicon substrate to remain passively (i.e., with no bias being applied thereto) in the HF solution for periods from about 10 minutes to about 90 minutes. The duration of this passive contact with the HF solution is another factor controlling the resultant peak wavelength (color) of emission of the finished device.

Preferably, the deposition 14 of the transparent semiconductor layer is effected by sputtering it onto the porous silicon region of the substrate. The transparent semiconductor layer is preferably deposited in a thickness ranging from about 3,000 Angstroms to about 5,000

Angstroms. Preferably, the deposited transparent semiconductor layer is patterned, either during its deposition through a shadow mask having circular windows of a desired diameter, or after its deposition as a solid layer by using a conventional photolithography and etching procedure.

The instances where the silicon substrate is formed of p-type silicon and the transparent semi-conductor layer is formed of an n-type material, the specific n-type material is chosen as one of a group consisting of AlP, GaP, ZnS, ZnSe, CdS, $ZnSiP_2$, $CdSiP_2$, $In_2O_3$, $SnO_2$, ITO ($In_2O_3+SnO_2$), ZnO, CdO, $Cd_2SnO_4$, GaInN, GaN, SiC, amorphous Si, amorphous SiC and appropriate alloys thereof. When the silicon substrate is formed of n-type silicon, the transparent semiconductor layer is formed of a p-type material comprising boron-doped diamond, Mg-doped GaN, GaP, AlP, SiC, amorphous Si, amorphous SiC, Nitrogen-doped ZnSe, ZnTe, $CuAlS_2$, $CuAlSe_2$, $CuGaS_2$, $ZnGeP_2$. For those materials which do not possess intrinsic n-type conductivity, such as AlP, GaP, SiC, amorphous silicon, the choice of n-type dopants available is well known to those skilled in the field. For those materials which do not possess intrinsic p-type conductivity, such as GaP, AlP, SiC, amorphous Si, the choice of p-type dopants available is well known to those skilled in the field.

Means to bias the resultant optoelectronic switching and display device includes a back contact layer formed on the back surface of the silicon substrate and electrical leads applying an a.c or d.c. voltage between the transparent semiconductor layer and the back contact layer. Preferably, the region adjacent the back contact layer is heavily doped, enhancing electrical conductivity and thus keeping series resistance low and device efficiency high. By applying a forward bias to the finished device, photoluminescence emanates therefrom from the transparent semi-conductor layer in a direction normal thereto. With the applied bias reversed, photoluminescence ceases. In cases where the silicon substrate is p-type, under forward bias, holes are being transferred from the silicon substrate into the porous-silicon region, through the "valence band." Simultaneously, the transparent semiconductor layer injects electrons into the "conduction band" of the porous-silicon region. In the porous-silicon region, these two carriers (holes and electrons) radiatively recombine and produce electroluminescence.

In addition to controlling the peak wavelength of luminescence of the device by the above-described etching procedure, we also demonstrated that by alloying the silicon substrate with germanium, the effective band gap of the device is decreased and its peak luminescence wavelength (hence its color) is shifted. By controlling the etch procedure and by alloying the silicon substrate with germanium, different emission colors can be selected and polychrome display panels can be manufactured from such devices. Preferably, the Si/Ge alloy contains from about zero Ge to about 30% Ge to Si, by weight.

Light emission from the finished optoelectronic device according to the invention only occurs when the same is forward biased. In a case where the Si substrate is p-type and the transparent semiconductor layer is n-type, positive voltage is applied to the back contact layer to forward bias the device. With reverse bias being applied to the device, its light emission is immediately cut off. Consequently, the device of the invention serves well as an optoelectronic switching device in computers.

Figure 2:
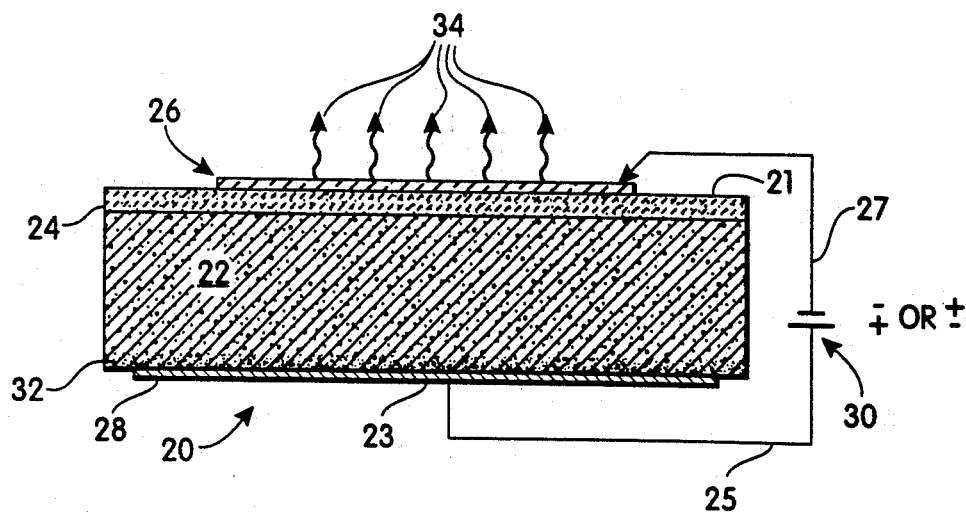
FIG. 2 is a schematic cross-sectional view of a representative high-efficiency solid state optoelectronic switching and display device manufactured according to the process of the invention.

FIG. 2 is a schematic cross-sectional view of a representative high-efficiency solid state optoelectronic switching and display device 20 manufactured according to the process described above and embodying the attributes and characteristics mentioned. The device 20 essentially comprises a silicon substrate 22 having opposed flat surfaces 21 and 23, a porous silicon region 24 formed in the silicon substrate 22 adjacent the top flat surface 21, a transparent semiconductor layer 26 deposited, such as by sputtering, on the porous silicon region 24. Means to forward or to reverse bias the device 20 includes a back contact layer 28 formed on the bottom flat surface 23 of the Si substrate 22 and electrical leads 25 and 27, respectively connected to a source of direct current (dc) 30 to supply electrical input power on the one hand and to the back contact layer 28 and the transparent semi-conductor layer 26, on the other. As mentioned, the silicon substrate 22 preferably is heavily doped in a region 32 adjacent the back contact layer 26, for the reasons adduced above. The optoelectronic solid state switching and display device 20 emits visible light-rays 34 from the transparent semiconductor layer 26 thereof in a direction normal thereto, whence it can be conveniently coupled, either via an optical fiber, not shown, or through free space by the use of lenses and mirrors, also not shown, to another operative component of a computer of which the device 20 forms a part.

This new device operates in marked contrast to observations of light emission from silicon p-n junctions when reverse-biased under avalanche breakdown conditions which involve high electric fields. See R. Newman, "Visible Light from a Silicon p-n Junction," *Physical Review*, Vol. 100, No. 2, Oct. 15, 1955; and A. G. Chynoweth et al, "Photon Emission from Avalanche Breakdown in Silicon," *Physical Review*, Vol. 102, No. 2, Apr. 15, 1956.

THE CHARTS OF FIGS. 4–8

FIGS. 4–8 depict charts showing various curves helpful in understanding certain principles of the invention.

Figure 4:
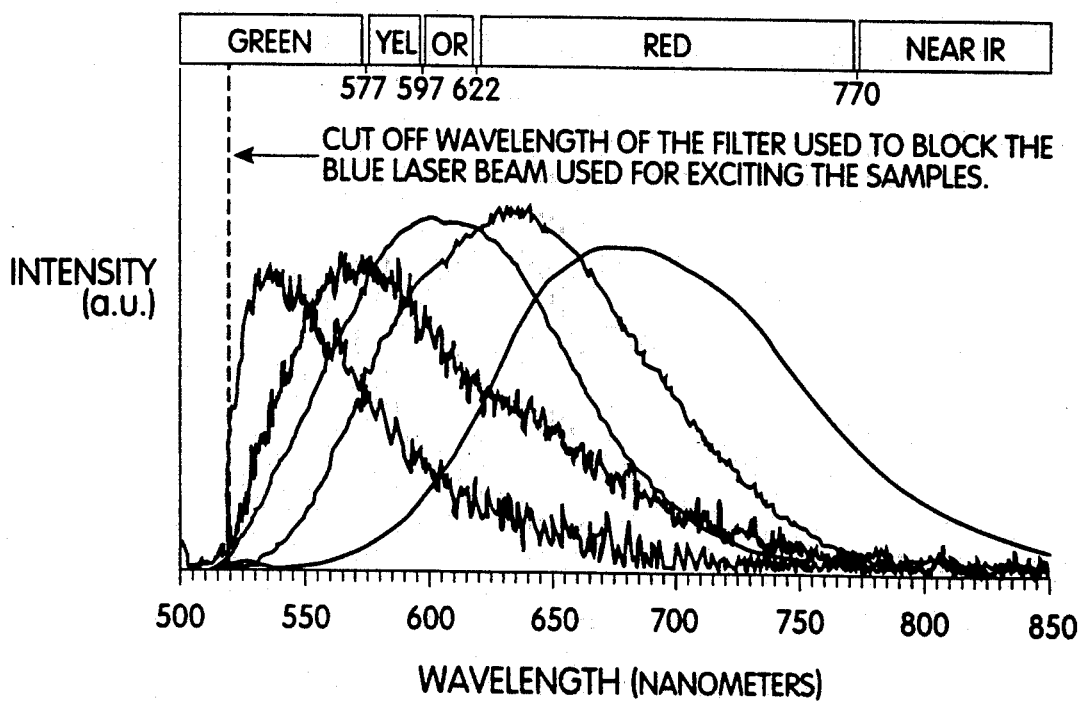
FIGS. 4–8 are charts representing various respective curves helpful in understanding the principles of the invention.

In FIG. 4, there is depicted the photoluminescence spectra of five porous-silicon samples formed under different conditions of chemical etching which led to different surface porosity therein. Asymmetries in some of the curves are an artifact from the use of an optical cutoff filter at 520 nanometers. Use of the filter was required to eliminate the photoexcitation laser line from entering the field of the detector. Excitation was obtained with an argon laser beam at 488 nm. Samples subjected to a gradient etch technique exhibited a red, orange, yellow and green emission pattern spatially resolved across the surface of the sample. Longer etch periods resulted in progressively smaller nanostructures in the silicon, and effected blue shifts (i.e., to the left in FIG. 4) in the emission wavelengths. The intensity (depicted in arbitrary units=a.u.) of the photoluminescence was comparable to that of a standard sample of AlGaAs material. When alloys of Si/Ge were prepared under conditions identical with high grade silicon samples, the peak wavelength of photoluminescence was always red-shifted (i.e., to the right in FIG. 4) in the emission wavelengths, indicating that alloying with Ge tends to decrease the band gap of such alloys. The above-noted observations allow circuit designers to select the emission colors of samples by alloying silicon with germanium. Consequently, polychrome display panels are within the reach of designers using the process of the invention. Also, by controlling the conditions of the electrochemical preparation procedure for the porous-silicon region, shifts in the emission wavelengths of samples can be effected.

Figure 5:
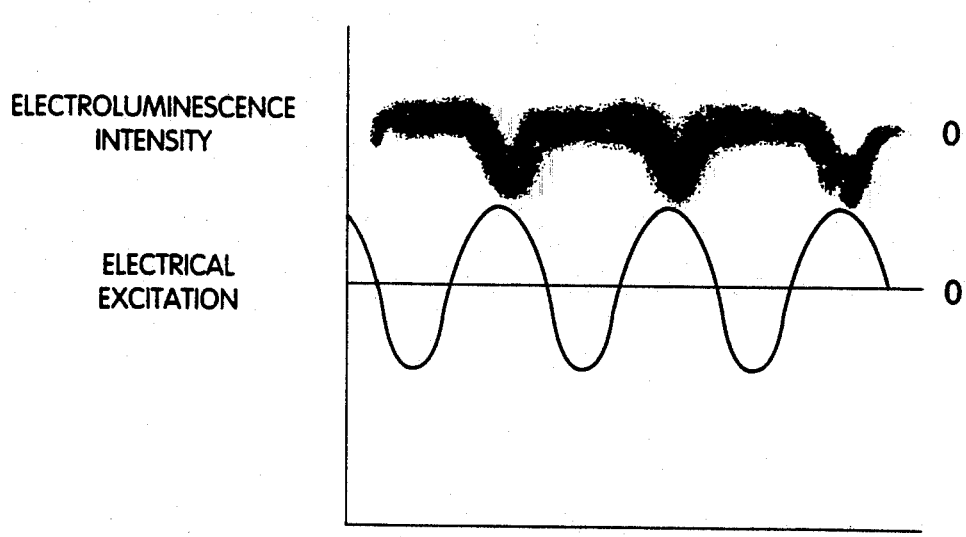

FIG. 5 shows the correlation between measured electroluminescence intensity and electrical excitation of a high efficiency solid state optoelectronic switching and display device 20 illustrated in FIG. 2. The tested device 20 was an n-p heterojunction porous silicon light emitting diode (LED) in which the transparent semiconductor layer 26 was an n-type indium-tin-oxide (ITO) film, formed onto the p-type substrate 22. With an ac input electrical signal, optical output 34 was only observed when the forward bias condition was encountered, i.e. when the porous silicon 24 was given a positive bias. In FIG. 5 no optical signal is observed during negative excursions of the electrical pulses. As evident, the occurrence of optical signals is directly correlated with positive cycles of the input electrical signal.

Figure 6:
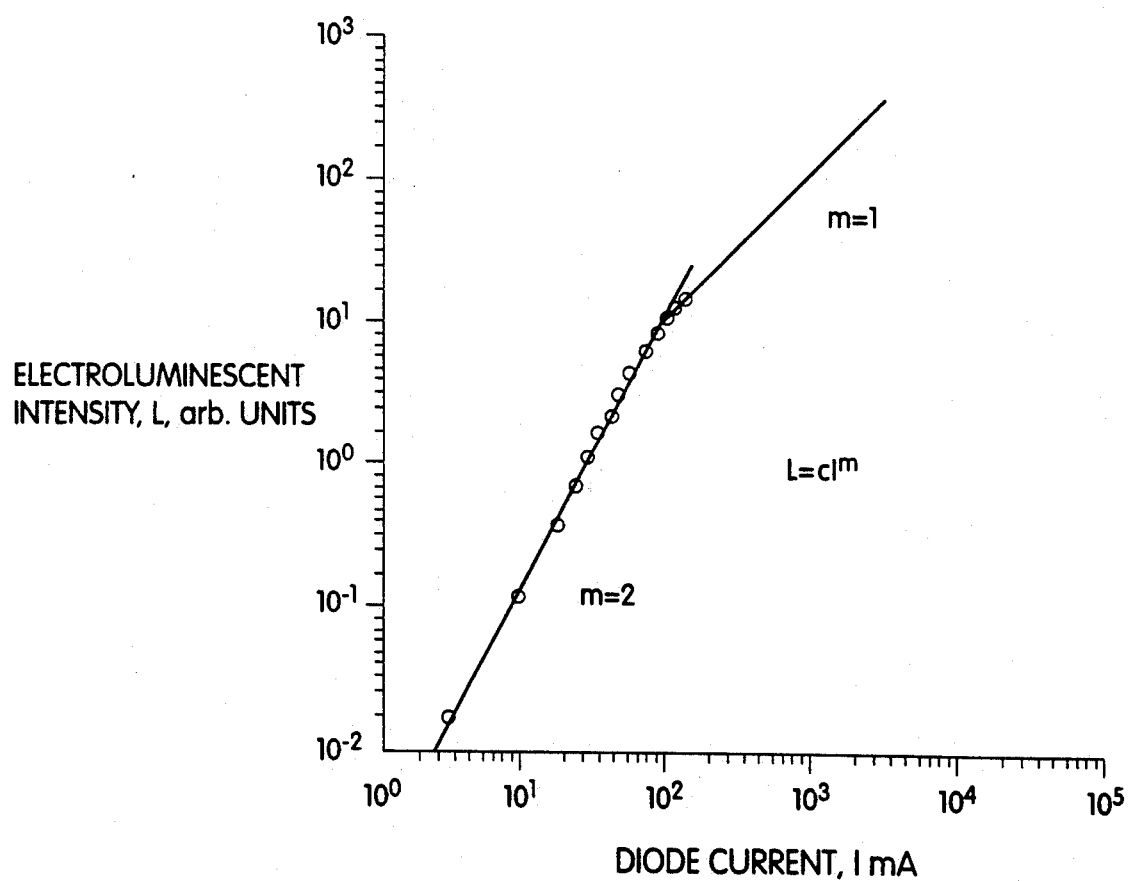

When the applied positive electrical current was increased in magnitude, the output optical signal was also found to increase in magnitude. This correlation is illustrated in FIG. 6. FIG. 6 indicates that at low levels of input current, the light intensity increases as the square of the electrical current. At higher levels of electrical current, the optical signal intensity becomes linear with the magnitude of the current. Such behavior has been known for GaAs LEDs, and explained in "Semiconductors Lasers and Heterojunction LEDs" by Henry Kressel and Jerome K. Butler, *Academic Press*, 1977, pp. 70-73. Our observation serves to indicate the close similarity in behavior that exists between porous silicon LEDs and standard GaAs LEDs. Specifically, it indicates that electroluminescence results from the injection of minority carrier electrons from the conduction band of the n-type transparent conducting surface film into the p-type porous silicon, where they recombine radiatively with available holes indigenous to p-type porous silicon. Alternatively, minority carrier holes may be injected from the valence band of a p-type transparent conducting surface film into n-type porous silicon, where the carrier holes may radiatively recombine with available electrons indigenous to the n-type porous silicon.

Figure 7:
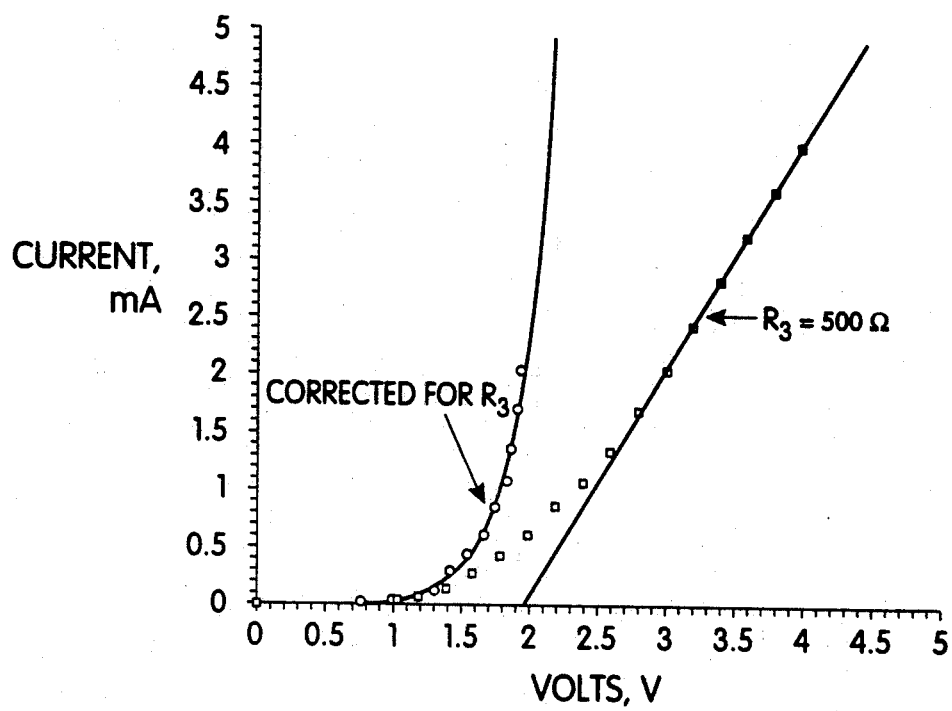
Figure 8:
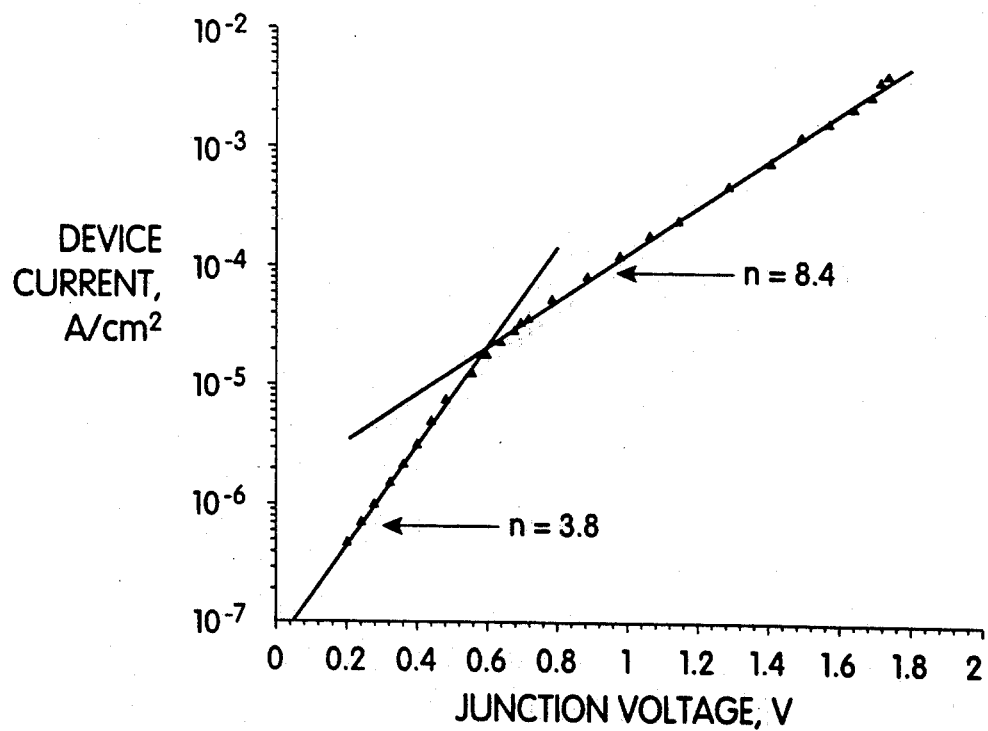

FIGS. 7 and 8 illustrate the dependence of the diode current on voltage. FIG. 7 shows that under certain circumstances of preparation of a porous silicon LED, a series resistance may be present. All semiconductor junction diodes exhibit a series resistance. The magnitude thereof depends upon specific materials preparation procedures. Because the series resistance is not an integral part of the porous silicon LED, but rather a result of certain preparation procedures, its effect may be removed from the current-voltage characteristics, to reveal the dependence of current on the voltage applied only to the diode junction, and not the fraction of the applied voltage which appears across the series resistance. When the effects of the series resistance are removed, the diode will support large electrical currents when the junction voltage is between 2 and 3 volts. High intensity light emission therefore, directly correlated with the electrical drive current, can be obtained when the applied junction voltage is between 2 and 3 volts.

FIG. 8 shows that the current-voltage (I-V) characteristics can be modelled by the standard Shockley diode equation, $$I = I_o \exp\left(\frac{qV}{mkT}\right)$$

where "m" is the junction ideality factor, "Io" is the diode saturation current, "q" is the unit of electronic chare, "k" is Boltzman's constant, and T=temperature (Kelvins). A high ideality factor indicates that a thin interfacial layer is present between the porous silicon and the transparent conducting film. Such thin interfacial layer must be no thicker than 2.5 nm so as to allow minority carriers to be transported through it by quantum mechanical tunnelling. Specifically, such interfacial layer is required to allow part of the applied voltage to reside across the interfacial layer. As a result, the applied voltage causes the electronic states of the conduction band of the transparent conductor film and the electronic states of the porous silicon conduction band to be brought into alignment. Such an alignment is necessary for quantum mechanical tunnelling of minority carriers to occur between the transparent conductor and the porous silicon. Without the presence of the interfacial layer, no minority carriers will be injected, and there can be no electroluminescence. No light emission can ever occur under reverse bias, because a reverse bias does not allow minority carriers to traverse the interfacial layer and enter the porous silicon, where they would be able to radiatively recombine with majority carriers.

Thus it has been shown and described a solid state optoelectronic switching and display device and a process developed for its manufacture, which device and process satisfy the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A solid state optoelectronic switching and display device comprising:
   (a) a silicon substrate having opposed flat surfaces;
   (b) a porous silicon region formed in said silicon substrate adjacent one of said opposed flat surfaces; and
   (c) a transparent semiconductor layer formed on said porous silicon region.

2. The solid state device of claim 1 wherein said silicon substrate is formed of p-type silicon and said transparent semiconductor layer is formed of n-type material.

3. The solid state device of claim 2 wherein said n-type material is one of a group consisting of AlP, GaP, ZnS, ZnSe, CdS, ZnSiP$_2$, CdSiP$_2$, In$_2$O$_3$, SnO$_2$, ITO (In$_2$O$_3$+SnO$_2$), ZnO, CdO, Cd$_2$SnO$_4$, GaInN, GaN, SiC, amorphous Si, and amorphous SiC.

4. The solid state device of claim 1 wherein said silicon substrate is formed of n-type silicon and said transparent semiconductor layer is formed of p-type material.

5. The solid state device of claim 5 wherein said p-type material is one of a group consisting of boron-doped diamond, GaN, GaP, AlP, SiC, amorphous Si, amorphous SiC, ZnSe, ZnTe, $CuAlS_2$, $CuAlSe_2$, $CuGaS_2$, $ZnGeP_2$.

6. The solid state device of claim 1 further including a back contact layer formed on the other of said opposed flat surfaces.

7. The solid state device of claim 1 further including means to forward bias said device, and wherein said device possesses peak power output in the visible spectrum.

8. The solid state device of claim 1 wherein said silicon substratate is one of a group consisting of (100) and (111) orientation, possessing a resistivity ranging from about 0.001 ohm-cm to about 50 ohms-cm, and a single-crystal silicon alloyed with germanium.

9. The solid state device of claim 1 wherein said transparent semiconductor wafer possesses an absorption edge at wavelengths shorter than the maximum emission wavelength of said porous silicon region.

10. The solid state device of claim 6 wherein said silicon substrate is further provided with a more heavily-doped region adjacent said back contact layer than in the remainder of said substrate.

* * * * *